(12) United States Patent
Ishida (10) Patent No.: US 6,198,139 B1
(45) Date of Patent: Mar. 6, 2001

(54) COMPLEMENTARY MOS DEVICE

(75) Inventor: Masahiro Ishida, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/259,328

(22) Filed: Mar. 1, 1999

(30) Foreign Application Priority Data

Sep. 14, 1998 (JP) .................................................. 10-260024

(51) Int. Cl.$^7$ .......................... H01L 29/76; H01L 29/94; H01L 31/062; H01L 31/113; H01L 31/119
(52) U.S. Cl. .............................................. 257/372; 257/369
(58) Field of Search ..................................... 257/369, 372, 257/375

(56) References Cited

U.S. PATENT DOCUMENTS

| | | |
|---|---|---|
| 4,970,568 | * 11/1990 | Hiraguchi et al. . |
| 5,304,833 | 4/1994 | Shigeki et al. . |
| 5,726,476 | * 3/1998 | Kim ...................................... 257/369 |
| 5,814,866 | * 9/1998 | Borland ................................ 257/369 |
| 5,838,047 | * 11/1998 | Yamauchi .............................. 257/372 |

FOREIGN PATENT DOCUMENTS 2660056    6/1997  (JP) .

* cited by examiner

*Primary Examiner*—Ngân V. Ngô
(74) *Attorney, Agent, or Firm*—McDermott, Will & Emery (57) ABSTRACT

A p$^-$ epitaxial layer is formed on the main surface of a p$^+$ silicon substrate. A p-type impurity region is formed extending from the main surface into epitaxial layer. P-type impurity region has a first region having a relatively large thickness and a second region having a relatively small thickness. A p-well is formed on first region and an n-well is formed on second region. A p MOS transistor is formed on n-well and an n MOS transistor is formed on p-well.

7 Claims, 9 Drawing Sheets

COMPLEMENTARY MOS DEVICE

BACKGROUND OF THE INVENTION

1. Field of the Invention

The present invention relates to a semiconductor device and a method of manufacturing the device, and more specifically to a semiconductor device having active regions of different conductivity types on a semiconductor substrate and a method of manufacturing the device.

2. Description of the Background Art

Conventionally, as an example of a semiconductor device having active regions of different conductivity types on the same semiconductor substrate, a complementary MOS (metal oxide semiconductor) device (hereinbelow simply referred to as "CMOS") is known which is configured by a p-channel MOS transistor and an n-channel MOS transistor.

A conventional CMOS is disclosed, for example, in Japanese Patent No. 2660056 (Japanese Patent Laying-Open No. 3-99464). There is a need for established miniaturization techniques that accompany the higher density and higher degree of integration achieved in a CMOS while maintaining its low power consumption characteristic is maintained.

Structurally, a parasitic bipolar transistor circuit is formed inside a CMOS. Since this bipolar transistor circuit has the same configuration as a thyristor, when the circuit is triggered by a surge or the like from outside, excessive current flows from a power supply terminal, and the so-called latchup phenomenon occurs, where the current continues to flow even after the surge or the like no longer exists. This latchup can destroy the device.

Since the latchup phenomenon more readily occurs as the element is miniaturized, a new structure is required which improves latchup resistance as a CMOS is further miniaturized. One example is a retrograde well structure using an epitaxial layer.

Figure 18:
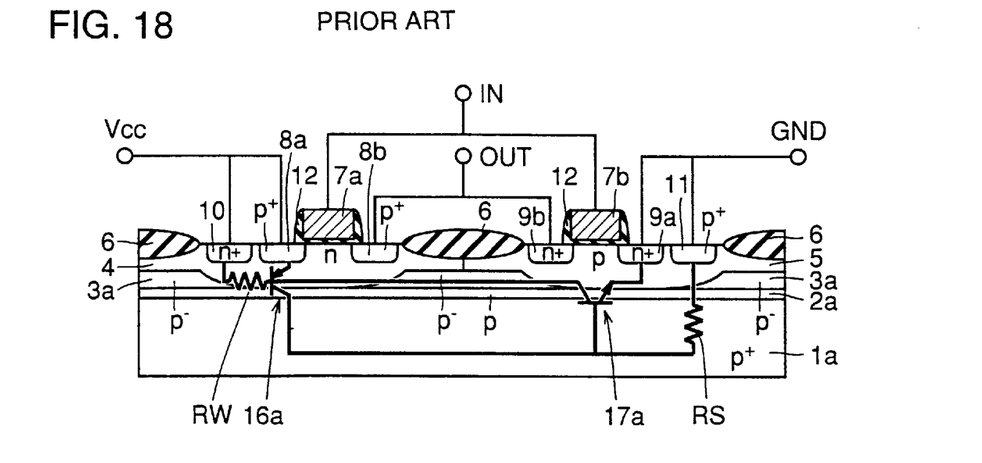
FIG. 18 is a cross sectional view of a conventional CMOS.

FIG. 18 shows a cross sectional view in which a CMOS inverter is formed upon an epitaxial wafer having a thin epitaxial layer formed on a silicon substrate. In addition, FIG. 18 also shows an equivalent circuit diagram of a parasitic thyristor.

As shown in FIG. 18, a p⁻ epitaxial layer 3a is formed on the main surface of a p⁺ silicon substrate 1a. On the boundary portion between p⁻ epitaxial layer 3a and silicon substrate 1a, a p-type impurity region 2a is formed. An n-well 4 and a p-well 5 are formed adjacent to each other in p⁻ epitaxial layer 3a. Moreover, a field oxide film 6 is selectively formed on a surface of p⁻ epitaxial layer 3a.

A p MOS transistor is formed on n-well 4, and an n MOS transistor is formed on p-well 5. The p MOS transistor is provided with a source region 8a, a drain region 8b, and a gate electrode 7a. The n MOS transistor is provided with a source region 9a, a drain region 9b, and a gate electrode 7b.

Side wall insulating films 12 are formed on the sidewalls of gate electrodes 7a, 7b. Moreover, an n-well contact region 10 is formed on n-well 4, and a p-well contact region 11 is formed on p-well 5.

N-well contact region 10 and source region 8a are connected to a power supply voltage Vcc, gate electrodes 7a, 7b are connected to an input terminal, and drain regions 8b, 9b are connected to an output terminal. Further, source region 9a and p-well contact region 11 are grounded (GND).

In the above-mentioned configuration, a parasitic vertical pnp bipolar transistor 16a with source region 8a serving as an emitter, n-well 4 as a base, and silicon substrate 1a as a collector, and a parasitic lateral npn bipolar transistor 17a with source region 9a serving as an emitter, p-well 5 as a base, and n-well 4 as a collector are formed. A parasitic thyristor is formed from parasitic vertical pnp bipolar transistor 16a and parasitic lateral npn bipolar transistor 17a.

N-well 4 has a retrograde well structure with a bottom portion having a high impurity concentration. Thus, parasitic resistance RW becomes small, and the difference in potential between the base and the emitter of parasitic vertical pnp bipolar transistor 16a also becomes small. Consequently, parasitic vertical pnp bipolar transistor 16a does not turn on easily. In addition, the impurity concentration in the region corresponding to the base of parasitic vertical pnp bipolar transistor 16a is high, causing more recoupling in the base and leading to a lower current amplification factor of parasitic vertical pnp bipolar transistor 16a.

Moreover, the use of p⁺ silicon substrate 1a reduces parasitic resistance RS, and the difference in potential between the base and the emitter of parasitic lateral npn bipolar transistor 17a becomes small. Thus, parasitic lateral npn bipolar transistor 17a does not turn on easily. In addition, the impurity concentration in the region corresponding to the base of parasitic lateral npn bipolar transistor 17a becomes high, resulting in more recoupling in the base and leading to a smaller current amplification factor of parasitic lateral npn bipolar transistor 17a.

Therefore, the loop gain of the parasitic thyristor formed by parasitic vertical pnp bipolar transistor 16a and parasitic lateral npn bipolar transistor 17a can be suppressed and latchup resistance may be improved.

In particular, the effect of reduced base resistance of parasitic lateral npn bipolar transistor 17a by the use of p⁺ silicon substrate 1a largely contributes to the improvement in latchup resistance. Through the use of p⁺ silicon substrate 1a, base resistance of parasitic lateral npn bipolar transistor 17a is reduced to one or two orders of magnitude smaller than that in the case of a typical wafer. As a result, the current required to forward bias the pn junction between the base and the emitter of parasitic lateral npn bipolar transistor 17a becomes extremely large. Since this current is provided by the collector current of parasitic vertical pnp bipolar transistor 16a, parasitic vertical pnp bipolar transistor needs to conduct a large current, resulting in high level injection region operation. Thus, the current amplification factor rapidly decreases, and latchup resistance is improved.

In view of the foregoing, it is preferable to reduce the thickness of p⁻ epitaxial layer 3a in order to improve the effect of reduced substrate resistance by p⁺ silicon substrate 1a. In other words, the effect of an epitaxial wafer becomes more conspicuous as the epitaxial layer becomes thinner.

As the epitaxial layer becomes thinner, however, the following problems may arise.

As shown in FIG. 18, p-type impurity region 2a is formed in the boundary portion between p⁺ silicon substrate 1a and p⁻ epitaxial layer 3a. P-type impurity diffuses from p⁺ silicon substrate 1a containing a high concentration of p-type impurity into p⁻ epitaxial layer 3a to form p-type impurity region 2a. Thus, the concentration of p-type impurity in p-type impurity region 2a gradually changes.

When p⁻ epitaxial layer 3a is made thinner in order to increase the effect of the epitaxial wafer as described above, p-type impurity region 2a reaches the high concentration region at the bottom portion of n-well 4, changing the distribution of impurity concentration of n-well 4 significantly. Thus, breakdown voltage between p-type source/ drain regions 8a, 8b and p⁺ silicon substrate 1a decreases and a punch-through phenomenon is more likely to occur.

SUMMARY OF THE INVENTION

The present invention was made to solve such problems as stated above. An object of the present invention is to improve latchup resistance while preventing a punch-through phenomenon.

The semiconductor device in accordance with the present invention is provided with a low specific resistance semiconductor substrate of a first conductivity type having a main surface, an epitaxial layer, a first active region of the first conductivity type, a second active region of a second conductivity type, and an impurity region of the first conductivity type. The epitaxial layer is formed on the main surface of the low specific resistance semiconductor substrate. The first and second active regions are formed in the epitaxial layer. The impurity region extends from the main surface of the semiconductor substrate into the epitaxial layer, and includes a first region located beneath the first active region and a second region located beneath the second active region and having a thickness smaller than the thickness of the first region. The low specific resistance semiconductor substrate herein refers to a semiconductor substrate having a specific resistance, for example, varying from approximately 0.01 to approximately 0.03 Ω·cm, which is smaller than that of a typical substrate.

As seen from above, making the thickness of the second region smaller than the thickness of the first region in the impurity region can keep the impurity region from reaching the second active region even if the epitaxial layer thickness becomes small. Thus, the decrease in the concentration of the impurity of the second conductivity type contained in the second active region caused by the impurity region reaching the second active region can be prevented, which reduces the parasitic resistance of the base of the parasitic bipolar transistor with the second active region serving as the base. As a result, the parasitic bipolar transistor is kept from being turned on, and the latchup resistance is improved. In addition, punch-through between the substrate and the region of the first conductivity type formed in the second active region may also be suppressed.

The first region preferably reaches the first active region, and the second region is preferably separated from the second active region.

The first region of the first conductivity type reaching the first active region of the first conductivity type reduces the parasitic resistance of the first active region. Consequently, the base parasitic resistance of the parasitic bipolar transistor with the first active region serving as the base may be reduced, and the parasitic bipolar transistor is kept from being turned on. In addition, since the second region is separated from the second active region, punch-through between the substrate and the region of the first conductivity type formed in the second active region may be prevented as described above. Moreover, the separation of the second region from the second active region increases the collector resistance of the parasitic bipolar transistor with the substrate serving as the collector. Thus, the current amplification factor of the parasitic bipolar transistor may be lowered.

The concentration of the impurity of the first conductivity type contained in the impurity region is higher than the impurity concentration of the epitaxial layer. The thickness of the epitaxial layer located between the second active region and the second region is larger than the thickness of the epitaxial layer located between the first active region and the first region.

As seen from above, the first and second regions of different thicknesses provided in the impurity region can make the thickness of the epitaxial layer located between the second active region and the second region larger than the thickness of the epitaxial layer located between the first active region and the first region. In consequence, punch-through between the substrate and the region of the first conductivity type formed in the second active region can be effectively suppressed while the latchup resistance is improved as described above.

The first active region preferably includes a first well of a first conductivity type, and the second active region preferably includes a second well of a second conductivity type. An MOS transistor of the second conductivity type is formed on the first well, and an MOS transistor of the first conductivity type is formed on the second well.

The present invention is useful in a semiconductor device having the above-described CMOS structure. Particularly, the present invention is advantageous where the first and second wells each have a retrograde well structure, for in such a case, the first and second wells may have high concentration portions at their bottom portions. The application of the present invention can prevent the impurity region from reaching the high concentration portion of the second well, and punch-through between the substrate and the region of the first conductivity type formed in the second well may be effectively suppressed.

The above-mentioned semiconductor device preferably has a memory cell including a pair of driver MOS transistors, a pair of access MOS transistors, and a pair of load elements.

The present invention is also applicable to a memory device such as an SRAM (Static Random Access Memory).

The present invention is particularly effective for a so-called full CMOS SRAM in which the load element is a p MOS transistor. In the full CMOS SRAM, an n MOS and a p MOS exist inside a memory cell. Therefore, there is a possibility of latchup occurring inside the memory cell. Since a minimum design rule applies to a memory cell, it is difficult to provide a guard ring for latchup prevention. Thus, the application of the present invention to the full CMOS SRAM eliminates the need to provide a guard ring and reduces the memory cell area.

The method of manufacturing the semiconductor device in accordance with the present invention includes the following steps. A high concentration portion containing an impurity of a first conductivity type having a relatively high concentration and a low concentration portion containing the impurity of the first conductivity type having a relatively low concentration are formed on the main surface of a low specific resistance semiconductor substrate of the first conductivity type. As an epitaxial layer is formed on the main surface, an impurity region of the first conductivity type extending from the main surface into the epitaxial layer and including a relatively thick first region and a relatively thin second region is formed. A first active region of the first conductivity type is formed on the first region. A second active region of a second conductivity type is formed on the second region. The low concentration portion refers to a portion where the concentration of an impurity of the first conductivity type is relatively lower than that of the high concentration portion. The low concentration portion may include the impurity of the first conductivity type having a generally high concentration.

By forming the epitaxial layer on the main surface including a high concentration portion and a low concentration portion, an impurity region having first and second regions of different thicknesses may be formed in the epitaxial layer. The relatively thick first region is formed on the high concentration portion, and the relatively thin second region is formed on the low concentration portion. Thus, with the second region formed thinner than the first region, punch-through between the substrate and the region of the first conductivity type formed in the second active region is prevented as described above. In addition, since the impurity region is kept from reaching the second active region, the base parasitic resistance of the parasitic bipolar transistor with the second active region serving as the base may be prevented from increasing. Consequently, the parasitic bipolar transistor is kept from being turned on. Further, since the epitaxial layer does not undergo processing such as etching, the development of defects in the epitaxial layer can be suppressed.

The step of forming the high concentration portion and the low concentration portion includes a step of selectively introducing an impurity of the first conductivity type into the main surface of the substrate.

By the selective introduction of the impurity of the first conductivity type into the main surface of the semiconductor substrate, the high concentration portion having a relatively high impurity concentration and the low concentration portion having a relatively low impurity concentration are formed in the main surface.

The step of selectively introducing an impurity of the first conductivity type into the main surface includes the following steps. A mask layer is formed selectively on the main surface. Using this mask layer, the impurity of the first conductivity type is selectively implanted into the main surface.

By the selective implantation of the impurity of the first conductivity type into the main surface using a mask, the high concentration portion having a relatively high impurity concentration and the low concentration portion having a relatively low impurity concentration may be formed in the main surface, producing such effects as described above.

The step of selectively introducing an impurity of the first conductivity type into the main surface may include the following steps. An impurity permeation prevention film for preventing the permeation of the impurity of the first conductivity type is selectively formed on the main surface. A film containing the impurity of the first conductivity type is formed on the main surface to cover this impurity permeation prevention film. The impurity of the first conductivity type is selectively diffused from the film containing the impurity of the first conductivity type into the substrate.

The impurity of the first conductivity type may also be selectively introduced into the main surface by this method, and the same effects as those in the example described earlier are obtained.

The first active region preferably includes a first well of the first conductivity type, and the second active region preferably includes a second well of a second conductivity type. In this instance, the step of forming the first active region preferably includes a step of introducing an impurity of the first conductivity type into an epitaxial layer located on a first region to form the first well to reach the first region. In addition, the step of forming the second active region preferably includes a step of introducing an impurity of the second conductivity type into the epitaxial layer located on a second region to form the second well separated from the second region.

In the above-described manner, the formation of the first and second active regions leads not only to a higher concentration of the impurity of the first conductivity type at the bottom portion of the first active region but also to preventing the decrease in the concentration of the impurity of the second conductivity type contained in the second active region caused by the overlapping of the second active region and the impurity region which are of different conductivity types. Thus, a semiconductor device having an improved latchup resistance is produced. Moreover, since the second region is separated from the second active region, punch-through resistance is also improved as seen above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in relation to FIGS. 1–17 below.

First Embodiment

Figure 1:
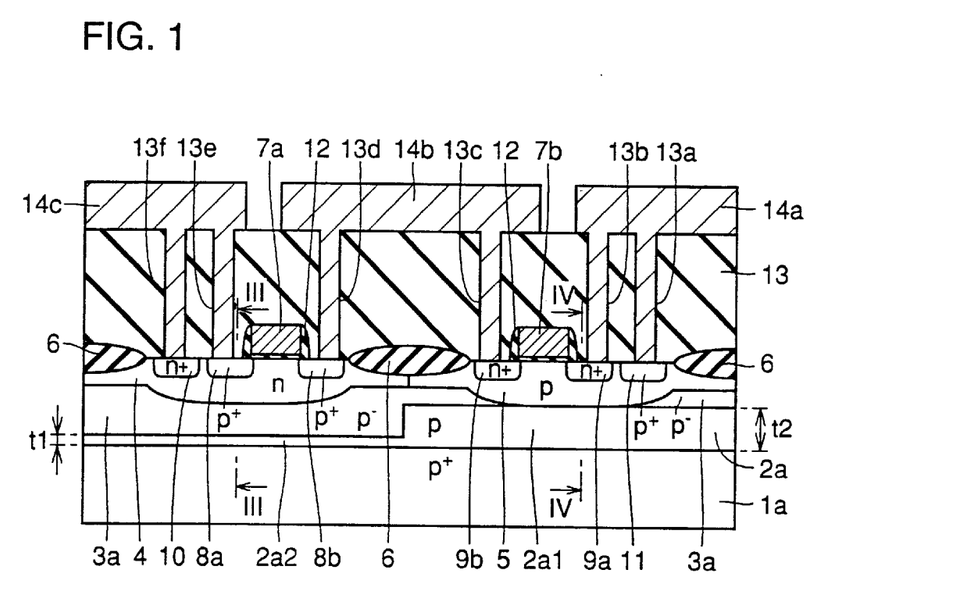
FIG. 1 is a cross sectional view of the CMOS according to the first embodiment of the present invention.
Figure 2:
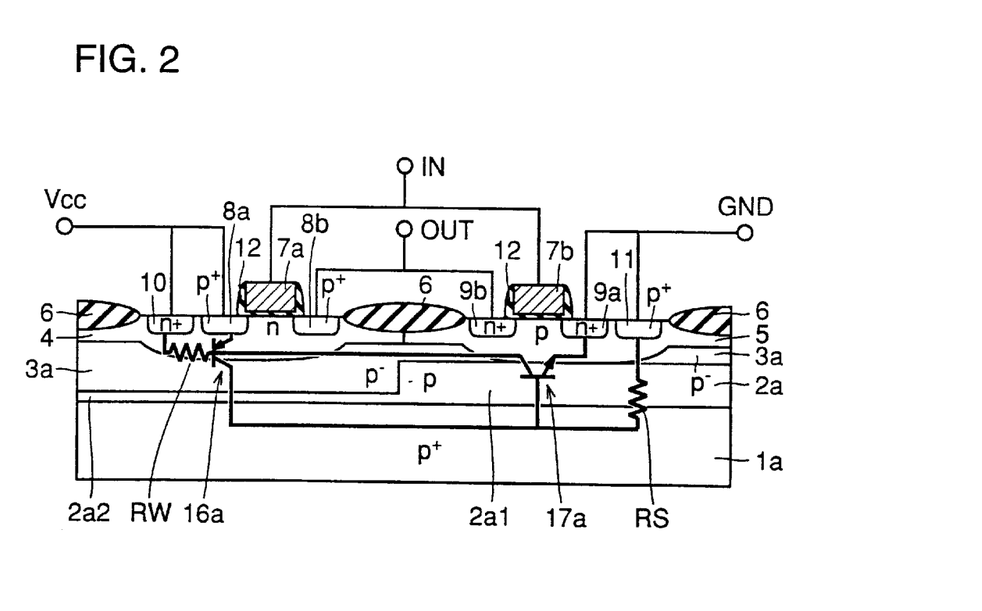
FIG. 2 is a cross sectional view of the CMOS accompanied by an equivalent circuit of a parasitic thyristor.

FIG. 1 is a cross sectional view of the CMOS according to the first embodiment of the present invention. FIG. 2 is a diagram showing a configuration of a CMOS inverter and an equivalent circuit of a parasitic thyristor.

As seen in FIG. 1, a $p^-$ epitaxial layer 3a is formed on the main surface of a $p^+$ silicon substrate 1a. The specific resistance of $p^+$ silicon substrate 1a ranges from approximately 0.01 to approximately 0.03 $\Omega$•cm. In addition, the specific resistance of $p^-$ epitaxial layer 3a is about 10 $\Omega$•cm, and the concentration of p-type impurity contained in the layer is approximately $1.5 \times 10^{15} cm^{-3}$.

The thickness of p⁻ epitaxial layer 3a is substantially uniform. P⁻ epitaxial layer 3a has a p-type impurity region 2a at the bottom portion.

The concentration of the p-type impurity contained in p-type impurity region 2a is higher than that of the impurity contained in p⁻ epitaxial layer 3a, but is lower than that of the impurity contained in p⁺ silicon substrate 1a. In addition, p-type impurity region 2a includes a first region 2a1 having a relatively large thickness t2 and a second region 2a2 having a relatively small thickness t1.

A p-well (active region) 5 of the same conductivity type as silicon substrate 1a is formed on the first region 2a1, and an n-well (active region) 4 of a different conductivity type from silicon substrate 1a is formed on the second region 2a2. N-well 4 and p-well 5 both have a retrograde well structure, and they each have high concentration portions of n-type and p-type at the bottom portions.

First region 2a1 of p-type impurity region 2a reaches p-well 5, and second region 2a2 of p-type impurity region 2a is separated from n-well 4. P-well 5 may be separated from first region 2a1; however, as such, the thickness of epitaxial layer 3a located between n-well 4 and second region 2a2 should be made larger than the thickness of epitaxial layer 3a located between p-well 5 and first region 2a1.

First and second regions 2a1, 2a2 contain a p-type impurity of a concentration higher than the p-type impurity contained in p⁻ epitaxial layer 3a and lower than the p-type impurity contained in p⁺ silicon substrate 1a as described above, since p-type impurity region 2a is formed when a p-type impurity such as boron (B) in silicon substrate 1a diffuses into epitaxial layer 3a by heat treatments or the like involved in the formation of epitaxial layer 3a and a field oxide film 6 as will be described.

In this manner, first region 2a1 which contains p-type impurity of a comparatively high concentration reaching p-well 5 causes the concentration of p-type impurity at the bottom portion of p-well 5 to increase. Further, the separation of n-well 4 from second region 2a2 containing about the same amount of p-type impurity as first region 2a1 helps to prevent the decrease in the concentration of n-type impurity contained in n-well 4. The present invention is particularly effective when n-well 4 has a retrograde well structure.

A p MOS transistor is formed on n-well 4, and an n MOS transistor is formed on p-well 5. Moreover, an n-well contact region 10 is formed in n-well 4, and a p-well contact region 11 is formed in p-well 5.

The p MOS transistor is provided with p-type source/drain regions 8a, 8b, and a gate electrode 7a. The n MOS transistor is provided with n-type source/drain regions 9a, 9b, and a gate electrode 7b. A sidewall insulating film 12 is formed on the sidewalls of gate electrodes 7a, 7b.

Field oxide film 6 is selectively formed on a surface of p⁻ epitaxial layer 3a. An interlayer insulating film 13 formed of a silicon oxide film or the like is formed with a thickness of about 100 to about 1,000 nm on p⁻ epitaxial layer 3a to cover n MOS transistor and p MOS transistor. Contact holes 13a–13f are formed in interlayer insulating film 13. Metal interconnections 14a–14c about 500 to about 2,000 nm thick are formed on interlayer insulating film 13 such that they extend inside contact holes 13a–13f.

Now, with reference to FIG. 2, the description of a CMOS inverter configuration and a parasitic thyristor will be given below.

As shown in FIG. 2, source region 8a and n-well contact region 10 are connected to a power supply voltage Vcc, while gate electrodes 7a, 7b are connected to an input terminal. Drain regions 8b, 9b are connected to an output terminal, and source region 9a and p-well contact region 11 are grounded (GND).

There are a parasitic vertical pnp bipolar transistor 16a having source region 8a serving as an emitter, n-well 4 as a base, and p⁺ silicon substrate 1a as a collector, and a parasitic lateral npn bipolar transistor 17a having source region 9a serving as an emitter, p-well 5 as a base, n-well 4 as a collector. A parasitic thyristor is formed from these parasitic bipolar transistors.

As seen from above, since an n-type high concentration portion is formed at the bottom portion of n-well 4, parasitic resistance RW may be reduced. Thus, loop gain of the parasitic thyristor is suppressed, and latchup resistance can be improved.

Furthermore, since second region 2a2 is made relatively thinner than first region 2a1 as shown in FIGS. 1 and 2, second region 2a2 is kept from reaching n-well 4. When n-well has a retrograde well structure, it is possible to prevent the p-type impurity from reaching the high concentration portion at the bottom portion of n-well 4. Consequently, the decrease in the concentration of the n-type impurity contained in n-well 4 may be suppressed, and the base parasitic resistance of parasitic vertical pnp bipolar transistor 16a may be kept low.

Moreover, as shown in FIGS. 1 and 2, the concentration of the p-type impurity contained in p-well 5 can be increased when first region 2a1 is allowed to reach p-well 5. As a result, the base parasitic resistance of parasitic lateral npn bipolar transistor 17a is lowered. From the foregoing, the latchup resistance is more effectively improved.

Now, the impurity profiles taken along the line III—III and the line IV—IV in FIG. 1 will be described in relation to FIGS. 3 and 4.

Figure 3:
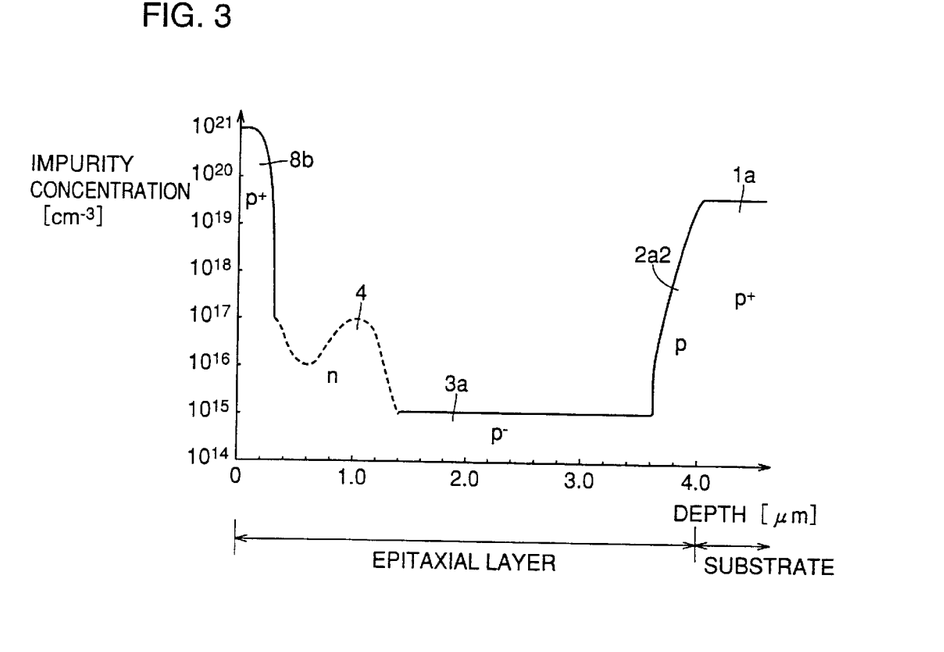
FIG. 3 is a diagram showing an example of an impurity profile taken along the line III—III in FIG. 1.

As shown in FIG. 3, a peak impurity concentration location, or the location in which the impurity concentration of n-type high concentration portion is at its peak, exists at the bottom portion of n-well 4. P⁻ epitaxial layer 3a of a low concentration lies between this peak impurity concentration location and second region 2a2 of p-type impurity region 2a. Thus, the punch-through resistance between silicon substrate 1a and source/drain regions 8a, 8b in FIGS. 1 and 2 is improved upon the conventional example.

Figure 4:
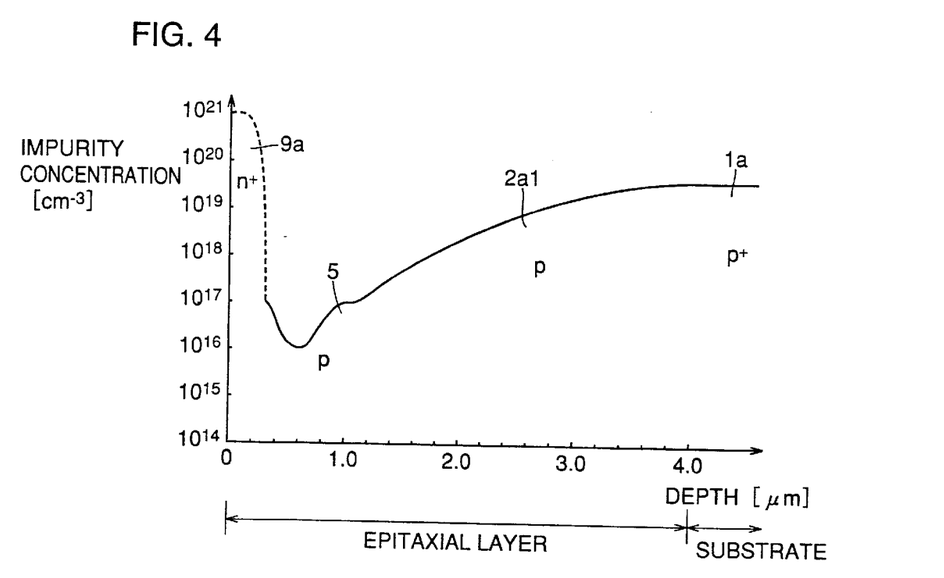
FIG. 4 is a diagram showing an example of an impurity profile taken along the line IV—IV in FIG. 1.

As seen from FIG. 4, a peak impurity concentration location of the p-type high concentration portion is located at the bottom portion of p-well 5. First region 2a1 is formed to reach the peak impurity concentration location, which leads to an increase in the concentration of the p-type impurity in p-well 5. First region 2a1 may be formed to reach a portion deeper than the peak impurity concentration location of p-well 5.

As seen from above, first and second regions 2a1, 2a2 are provided in p-type impurity region 2a to ensure punch-through resistance between substrate 1a and source/drain regions 8a, 8b even when the thickness of epitaxial layer 3a is reduced. As a result, the punch-through resistance as well as the latchup resistance may be improved upon the conventional example.

Now, the method of manufacturing the CMOS shown in FIG. 1 will be described with reference to FIGS. 5–9.

Figure 5:
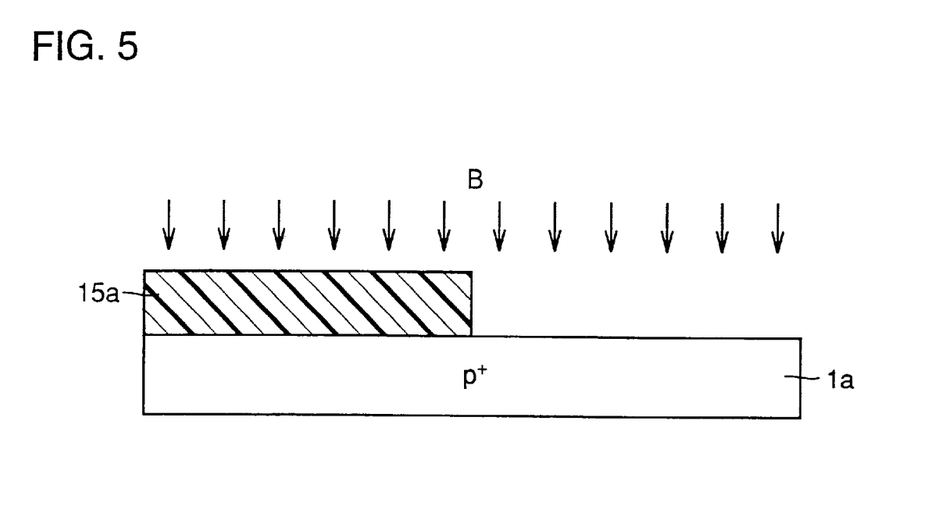
FIGS. 5–9 are cross sectional views showing the first to fifth steps of the manufacturing process of the CMOS shown in FIG. 1.

A resist 15a is applied to the main surface of silicon substrate 1a, and is patterned into a prescribed shape as shown in FIG. 5. Thereafter, using patterned resist 15a as a mask, a p-type impurity such as boron (B) is implanted into silicon substrate 1a, for example, at 30 keV to 50 keV with a dosage of $5.0×10^{15} cm^{-2}$ or below.

Figure 6:
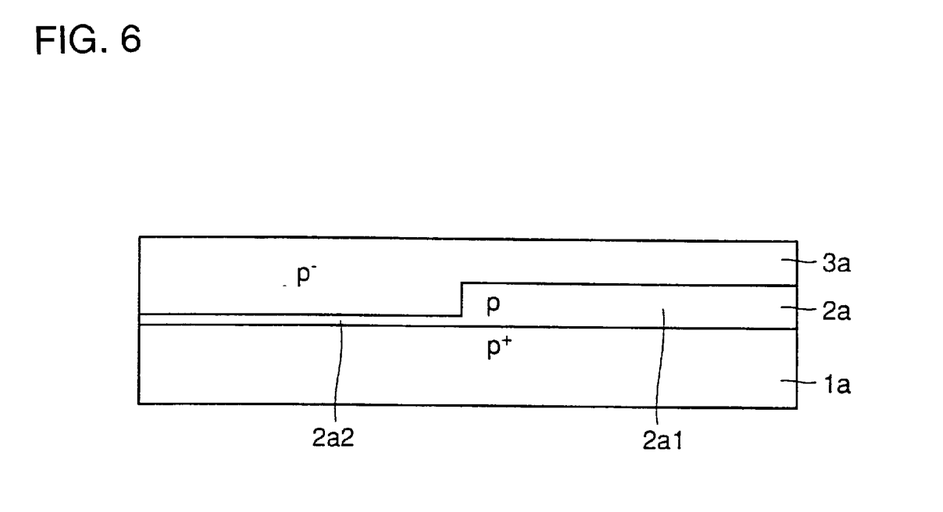

Next, after resist 15a is removed, p⁻ epitaxial layer 3a is formed with a thickness of about 10 μm on the main surface of p⁺ silicon substrate 1a as shown in FIG. 6. Epitaxial layer 3a is formed, for example at 1200° C.; therefore, the p-type impurity is diffused from silicon substrate 1a into epitaxial layer 3a. At this time, as a consequence of the above-described implantation of the p-type impurity, there exists on the main surface of silicon substrate 1a a high concentration portion containing the p-type impurity of a relatively high concentration and a low concentration portion containing the p-type impurity of a relatively low concentration.

Since more p-type impurity diffuses into epitaxial layer 3a from the high concentration portion than from the low concentration portion, a first region 2a1 having a relatively large thickness and a second region 2a2 having a relatively small thickness are formed as a result. More specifically, first region 2a1 is formed on the high concentration portion and second region 2a2 is formed on the low concentration portion. Although the term "low concentration portion" is used for ease of description, the above-described low concentration portion contains more impurity than a typical low concentration region.

Although a p-type impurity is doped into silicon substrate 1a to provide portions of different p-type impurity concentrations in the main surface of silicon substrate 1a in this embodiment, for example, by implanting an n-type impurity into a prescribed region in the main surface of a silicon substrate 1a in a manner analogous to the above-described example, a difference in p-type impurity concentration maybe provided.

Figure 7:
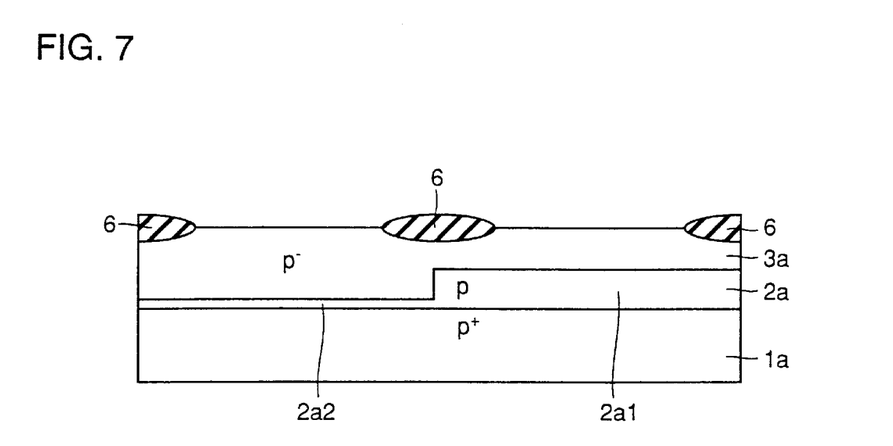

Next, as shown in FIG. 7, a field oxide film 6 is selectively formed on the surface of epitaxial layer 3a using the LOCOS (Local Oxidation of Silicon) method or the like. By this heat treatment, first and second regions 2a1, 2a2 become thicker.

Figure 8:
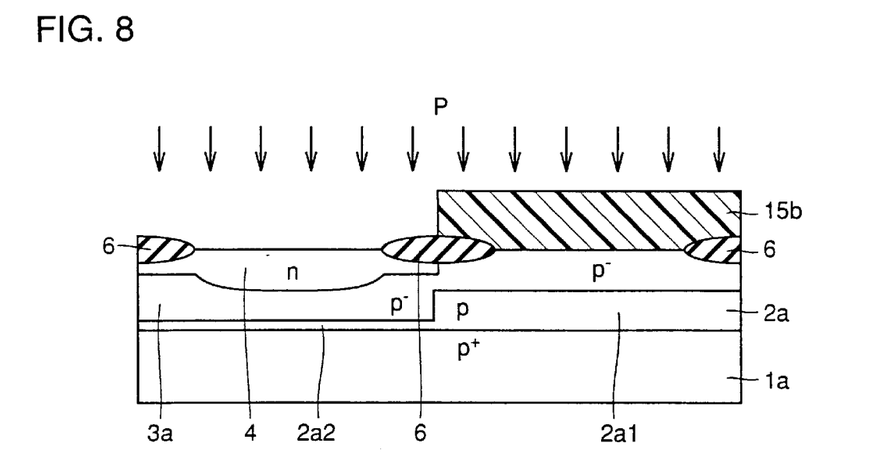

Then, as seen from FIG. 8, a resist 15b is formed covering first region 2a1 and leaving exposed a surface of epitaxial layer 3a llocated directly above second region 2a2. With resist 15b used as a mask, phosphorus (P) and boron (B) are implanted into epitaxial layer 3a. Phosphorus (P) is implanted at 700 keV with a dosage of $1.0×10^{13} cm^{-2}$, then phosphorus (P) is implanted at 200 keV with a dosage of $1.0×10^{12} cm^{-2}$, and then, boron (B) is implanted at 20 keV with a dosage of $1.5×10^{12} cm^{-2}$. Thus, n-well 4 is formed such that it is separated from second region 2a2.

Figure 9:
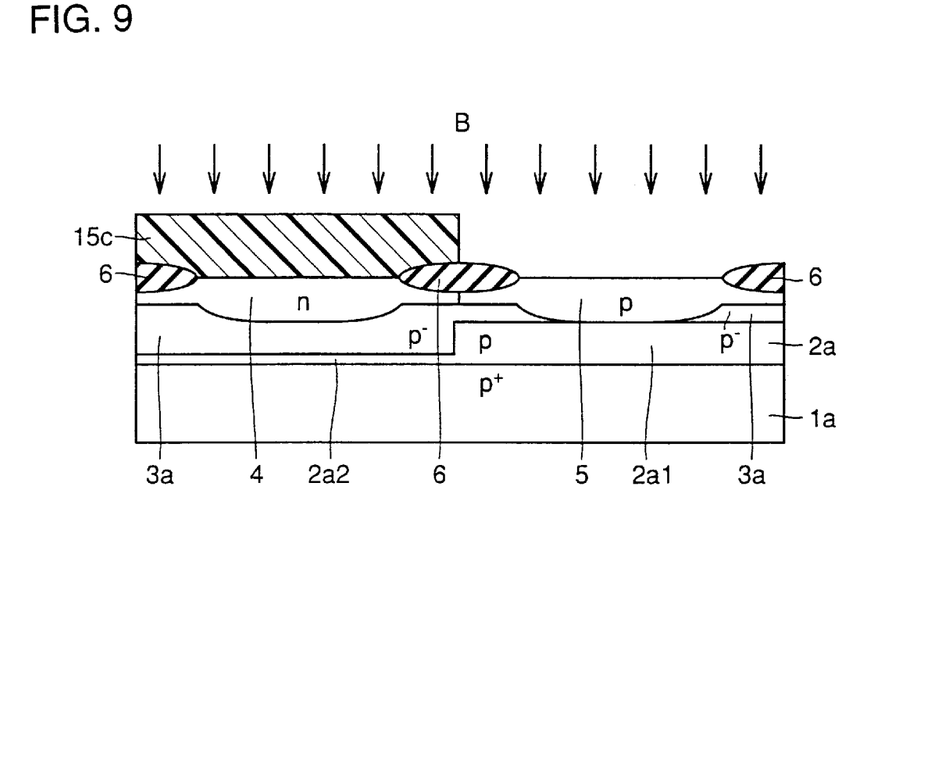

Thereafter, as shown in FIG. 9, a resist 15c is formed covering second region 2a2 and leaving exposed a surface of epitaxial layer 3a located directly above first region 2a1. With resist 15c used as a mask, boron (B) is implanted into epitaxial layer 3a at 400 keV with a dosage of $1.0×10^{13} cm^{-2}$, then at 100 keV at a dosage of $1.0×10^{12} cm^{-2}$, and then at 50 keV with a dosage of $2.5×10^{12} cm^{-2}$. In this manner, p-well 5 is formed to reach first region 2a1. Since the above-specified conditions for forming n-well 4 and p-well 5 are given merely as an example, other conditions may be adopted.

A gate oxide film having a thickness of about 10 to about 100 nm is then formed by thermal oxidation or the like on a portion which later becomes an active element region of an MOS transistor, and a conductive film such as a polycrystalline silicon film is deposited on the gate oxide film. The conductive film is patterned to form gate electrodes 7a, 7b. Then, to cover the gate electrodes, an insulating film such as a silicon oxide film is deposited, and then the insulating film is etched by dry etching or the like. Thus, a sidewall insulating film 12 is formed.

Next, n-type impurity and p-type impurity are selectively implanted into n-well 4 or p-well 5 to form source/drain regions 8a, 9a, 8b, 9b, an n-well contact region 10, and a p-well contact region 11.

Then, an interlayer insulating film 13 made of a silicon oxide film or the like is formed using a method such as CVD (Chemical Vapor Deposition) method. Contact holes 13a–13f are formed in interlayer insulating film 13 by photolithography and etching. Thereafter, metal interconnections 14a, 14b, 14c made of aluminum or the like are formed using a method such as sputtering. Through the above steps, a CMOS shown in FIG. 1 is formed.

Figure 11:
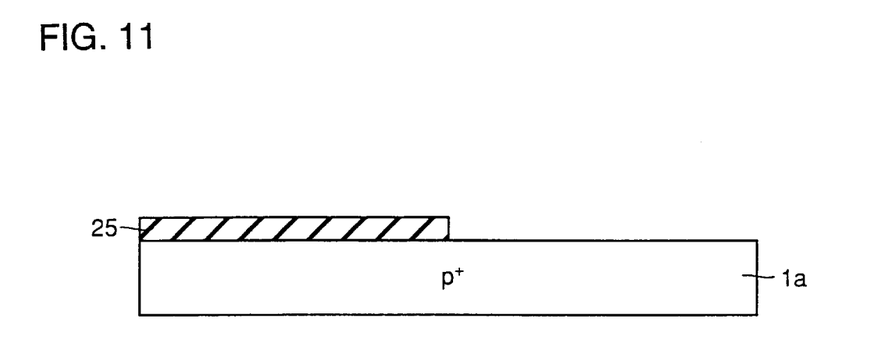
Figure 12:
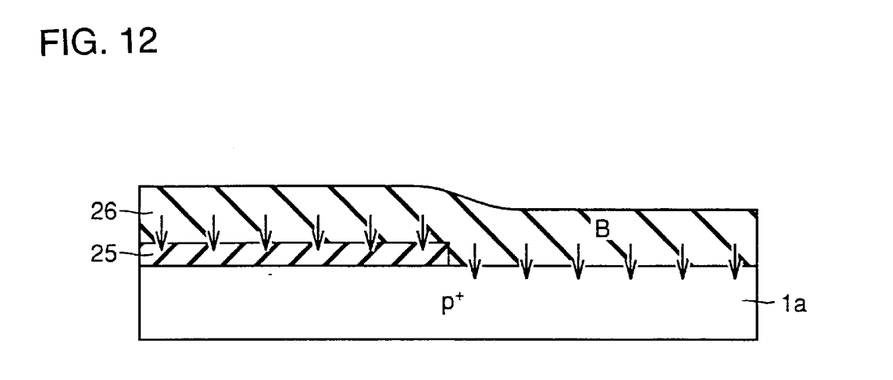

Now, another example of the method of selectively introducing a p-type impurity into silicon substrate 1a will be described in relation to FIGS. 10–12. This method is also applicable to second to fourth embodiments as will be described.

Figure 10:
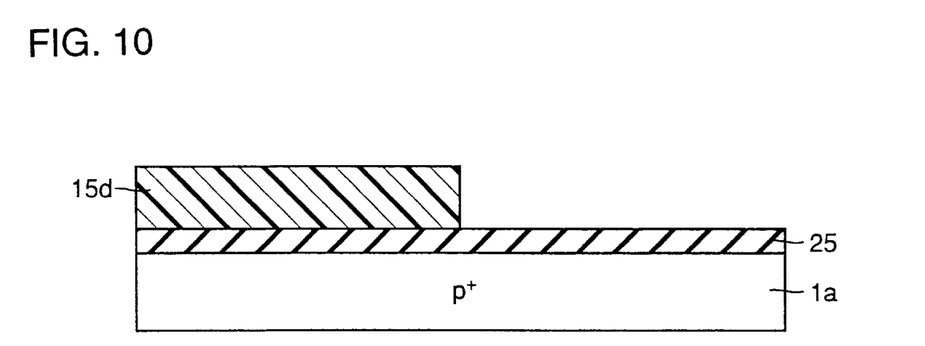
FIGS. 10–12 are cross sectional views showing the first to third steps in another example of the method of introducing an impurity into a semiconductor substrate.

A nitride film 25 is deposited on the main surface of silicon substrate 1a as shown in FIG. 10. A resist 15d is formed on nitride film 25, and nitride film 25 is patterned using resist 15d as a mask. Thus, nitride film 25 is formed selectively leaving the main surface of silicon substrate 1a exposed as shown in FIG. 11.

Then, a BSG (Borosilicate glass) film 26 is deposited on the main surface, covering nitride film 25. Boron is diffused from BSG film 26 into silicon substrate 1a. At this time, nitride film 25 prevents the permeation of boron. In this manner, boron is selectively diffused into silicon substrate 1a to form in the main surface a high concentration portion containing the p-type impurity of a relatively high concentration and a low concentration portion containing the p-type impurity of a relatively low concentration. Thereafter, BSG film 26 and nitride film 25 are removed, and an epitaxial layer 3a is formed. Thus, epitaxial layer 3a similar to that in FIG. 6 may be formed.

Any other film that can prevent the permeation of an impurity may be used as a substitute for nitride film 25. In addition, any other film besides BSG film 26 may be used if the film can be doped with a p-type impurity.

With the method of manufacturing the CMOS according to this embodiment, not only can a CMOS having improved latchup resistance and punch-through resistance be formed, but also the development of defects in epitaxial layer 3a can be suppressed since epitaxial layer 3a does not undergo processing such as etching.

Second Embodiment

Figure 13:
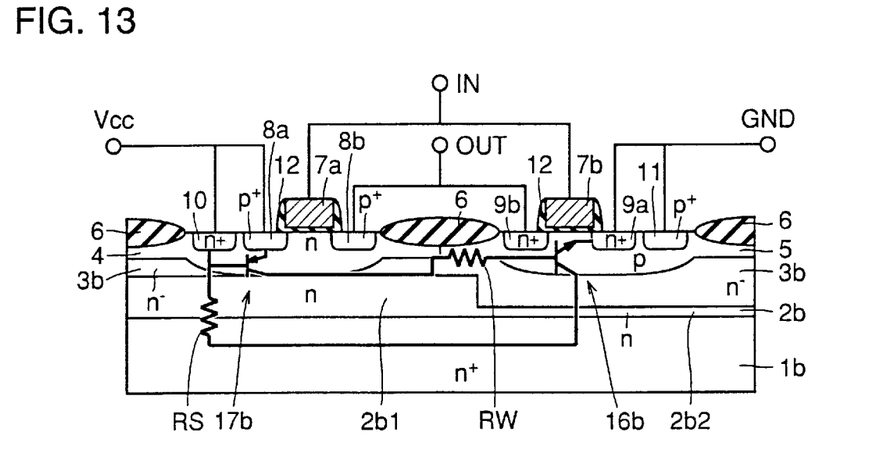
FIG. 13 is a cross sectional view of the CMOS according to the second embodiment accompanied by an equivalent circuit of a parasitic thyristor.

The second embodiment of the present invention will be described in relation to FIG. 13. FIG. 13 is a cross sectional view showing the CMOS according to the second embodiment of the present invention.

Referring to FIG. 13, in the second embodiment, an n⁻ epitaxial layer 3b is formed on the main surface of an n⁺ silicon substrate 1b with an n-type impurity region 2b formed therebetween. N-type impurity region 2b has a first region 2b1 having a relatively large thickness and a second region 2b2 having a relatively small thickness.

In the second embodiment of the present invention, a parasitic thyristor is formed by a parasitic vertical npn bipolar transistor 16b and a parasitic lateral pnp bipolar transistor 17b.

Other structures are similar to those in the first embodiment. The same effects as those obtained from the first embodiment may be expected from the second embodiment.

As to the method of manufacturing the CMOS according to the second embodiment of the present invention, an n-type impurity such as phosphorus (P) is selectively introduced into the main surface of silicon substrate 1b in a similar manner to that in the first embodiment, and n⁻ epitaxial layer 3b is formed on the main surface. The dosage with which and the energy level at which the n-type impurity is introduced into the main surface of silicon substrate 1b may be about the same as the dosage and the energy level employed for the implantation of the p-type impurity in the first embodiment. Other processes are similar to those in the first embodiment.

Third Embodiment

Figure 14:
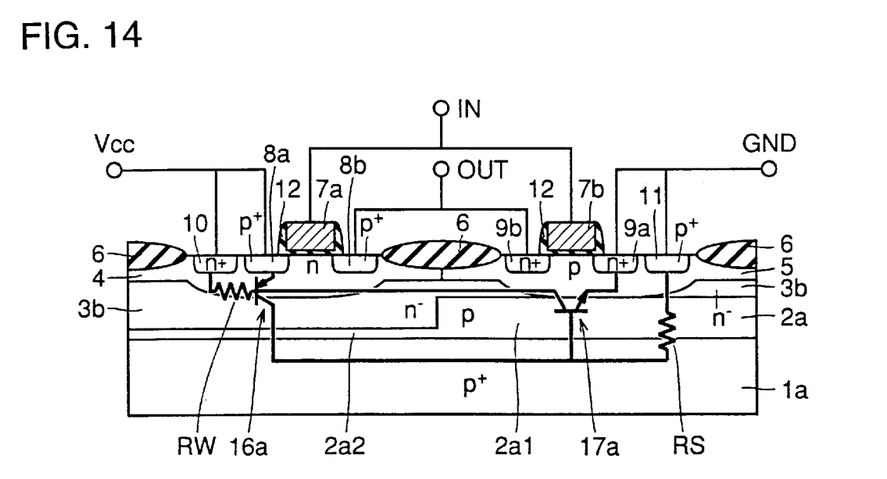
FIG. 14 is a cross sectional view of the CMOS according to the third embodiment accompanied by an equivalent circuit of a parasitic thyristor.

FIG. 14 shows a cross sectional structure of the CMOS according to the third embodiment. In the third embodiment, n⁻ epitaxial layer 3b is formed on the main surface of p⁺ silicon substrate 1a as shown in FIG. 14. Other structures are similar to those in the first embodiment. The same effects as those obtained from the first embodiment may be expected from the third embodiment.

As to the manufacturing method, a p-type impurity is selectively introduced into the main surface of p⁺ silicon substrate 1a, and n⁻ epitaxial layer 3b is formed on the main surface in a manner analogous to that in the first embodiment. Other processes are similar to those in the first embodiment.

Fourth Embodiment

Figure 15:
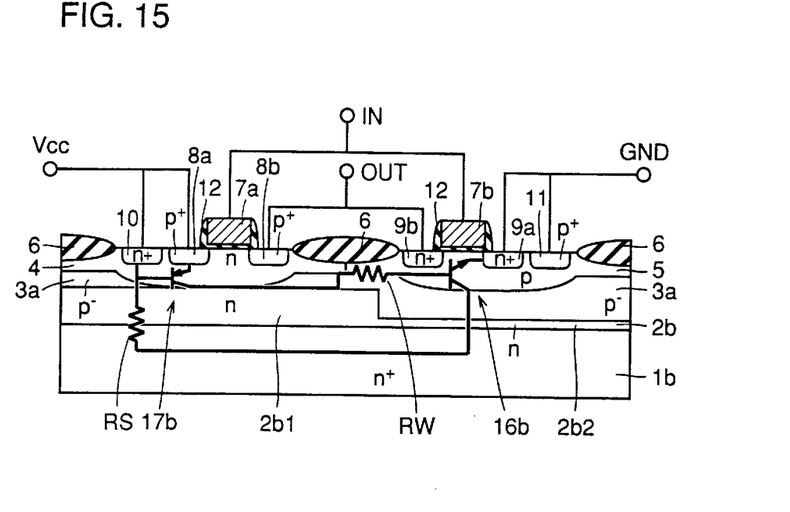
FIG. 15 is a cross sectional view of the CMOS according to the fourth embodiment accompanied by an equivalent circuit of a parasitic thyristor.

FIG. 15 shows a cross sectional structure of the CMOS according to the fourth embodiment. In the fourth embodiment, p⁻ epitaxial layer 3a is formed on the main surface of n⁺ silicon substrate 1b as shown in FIG. 15. Moreover, an n-type impurity region 2b is formed in epitaxial layer 3a, and has first and second regions 2b1, 2b2. Furthermore, a parasitic thyristor is formed by a parasitic vertical npn bipolar transistor 16b and a parasitic lateral pnp bipolar transistor 17b. Other structures are similar to those in the first embodiment. The same effects as those obtained from the first embodiment may be expected from the fourth embodiment.

As to the method of manufacturing of the CMOS according to the fourth embodiment, an n-type impurity is selectively introduced into the main surface of n⁺ silicon substrate 1b in a manner analogous to that in the second embodiment, and p⁻ epitaxial layer 3a is formed on the main surface. Thereafter, similar steps to those in the first embodiment are employed.

Fifth Embodiment

Now, the fifth embodiment, in which the concept of the first embodiment is applied to an SRAM, will be described with reference to FIGS. 16 and 17. The concepts of the second to fourth embodiments are also applicable to the SRAM.

Figure 16:
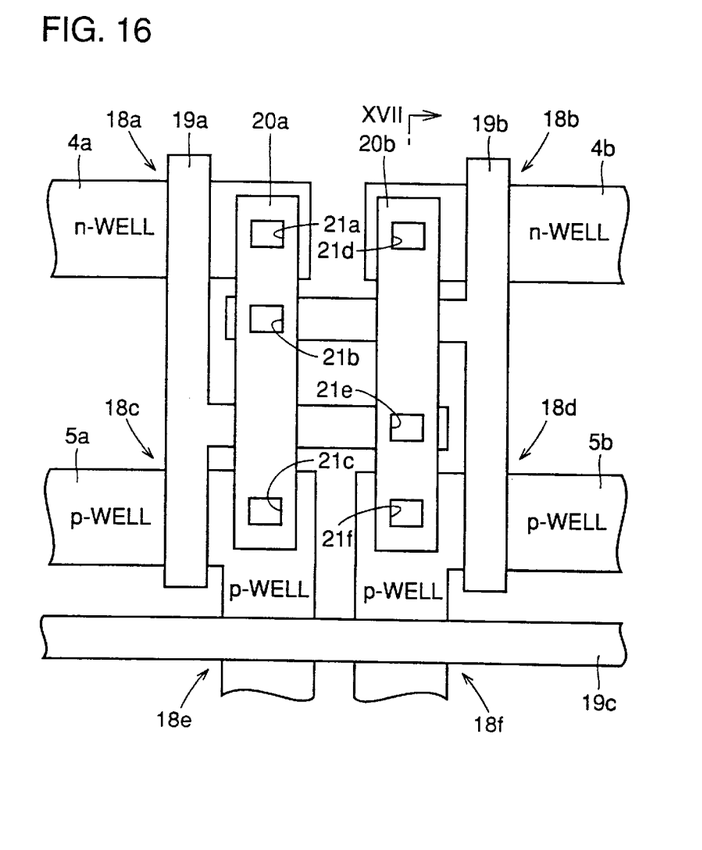
FIG. 16 is a plan view of a memory cell of the SRAM according to the fifth embodiment of the present invention.

FIG. 16 is a plan view of a memory cell of a full CMOS SRAM. FIG. 17 is a cross sectional view taken along the line XVII—XVII in FIG. 16.

As seen in FIG. 16, n-wells 4a, 4b are formed spaced apart, and p-wells 5a, 5b are formed spaced apart. A gate electrode 19a is formed extending over n-well 4a and p-well 5a, a gate electrode 19b is formed extending over n-well 4b and p-well 5b, and a gate electrode 19c is formed extending over p-wells 5a, 5b.

A p MOS transistor (load transistor) 18a is formed on the intersection portion of gate electrode 19a and n-well 4a, and a p MOS transistor (load transistor) 18b is formed on the intersection portion of n-well 4b and gate electrode 19b.

An n MOS transistor (driver transistor) 18c is formed on the intersection portion of p-well 5a and gate electrode 19a, and an n MOS transistor (driver transistor) 18d is formed on the intersection portion of p-well 5b and gate electrode 19b.

In addition, an n MOS transistor (access transistor) 18e is formed on the intersection portion of p-well 5a and gate electrode 19c, and an n MOS transistor (access transistor) 18f is formed oil the intersection portion of p-well 5b and gate electrode 19c.

A prescribed impurity region in n-well 4a, gate electrode 19b, and a prescribed impurity region in p-well 5a are connected by a local interconnection 20a via contact holes 21a–21c. A prescribed impurity region in n-well 4b, gate electrode 19a, and a prescribed impurity region in p-well 5b are connected by a local interconnection 20b via contact holes 21d–21f.

Figure 17:
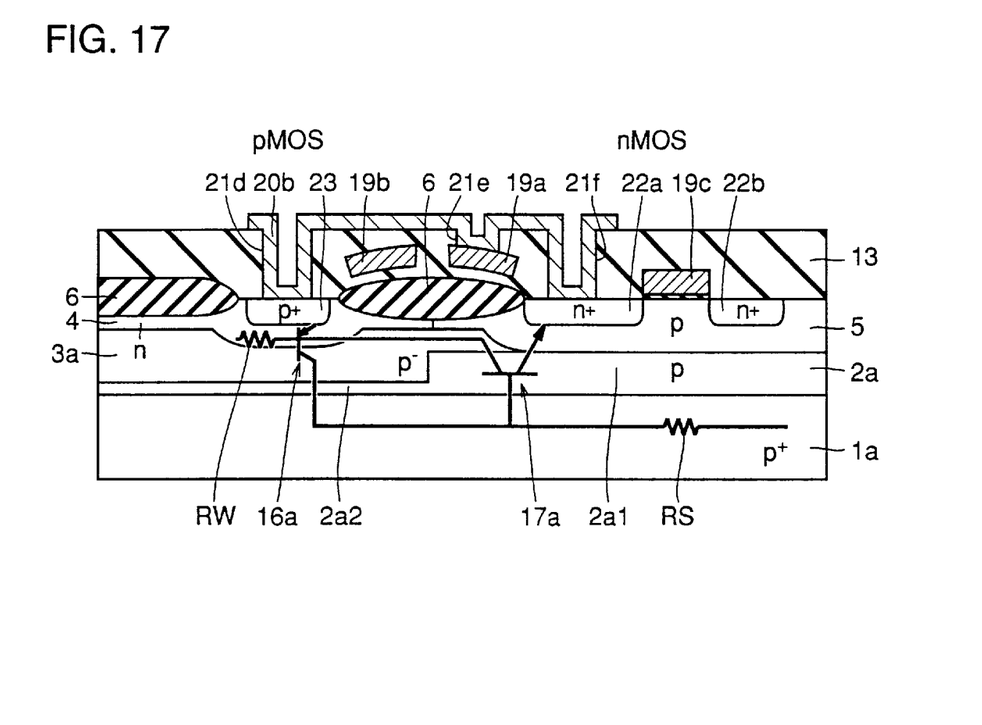
FIG. 17 is a cross sectional view taken along the line XVII—XVII in FIG. 16.

As seen in FIG. 17, an n MOS transistor is formed on p-well 5 located directly above a first region 2a1 of a p-type impurity region 2a, and a p MOS transistor is formed on n-well 4 located directly above a second region 2a2. The p MOS transistor has a p-type impurity region 23 which later becomes a drain, and n MOS transistor is provided with gate electrode 19c and n-type impurity regions 22a, 22b which later become source/drain.

An interlayer insulating film 13 is formed to cover the p MOS transistor and the n MOS transistor, and contact holes 21d–21f are formed in interlayer insulating film 13. A local interconnection 20b is formed extending from inside contact holes 21d–21f and over interlayer insulating film 13.

Thus, the present invention may be applied to a full CMOS SRAM so that latchup inside a memory cell can be effectively suppressed. Therefore, there no longer is a need to provide a guard ring for latchup prevention inside the memory cell, and the memory cell area may be reduced. The present invention is particularly effective when the cell area becomes smaller with further miniaturization.

While various embodiments have been described above, the concepts of the present invention is applicable to all devices having a CMOS structure including memories such as a DRAM (Dynamic Random Access Memory) or a BiCMOS. When the concept of the present invention is applied to such a device, it is particularly preferable to employ a p⁺ silicon substrate 1a. When applying the present invention to an SRAM, it is preferable to employ an n⁺ silicon substrate 1b. In addition, when the substrate and the epitaxial layer are of the same conductivity type, a single well structure may be employed.

As described above, according to the present invention, since it is possible to reduce the base parasitic resistance of the two parasitic bipolar transistors forming a parasitic thyristor, the bipolar transistors are kept from being turned on, and the latchup resistance is improved. What is more, punch-through between the substrate and a region having the same conductivity type as the substrate in the second active region is prevented. Furthermore, since the epitaxial layer does not undergo processing such as etching, the development of crystal defects can be prevented. As a result, a highly reliable semiconductor device is produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
a low specific resistance semiconductor substrate of a first conductivity type having a main surface;
an epitaxial layer on said main surface;
a first active region of the first conductivity type in said epitaxial layer;
a second active region of a second conductivity type in said epitaxial layer; and
an impurity region of the first conductivity type including a first region extending from said main surface into said epitaxial layer and located beneath said first active region and a second region located beneath said second active region and having a thickness smaller than that of said first region.

2. The semiconductor device according to claim 1, wherein said first region reaches said first active region and said second region is separated from said second active region.

3. The semiconductor device according to claim 1, wherein concentration of the impurity of the first conductivity type contained in said impurity region is higher than concentration of an impurity in said epitaxial layer, and
the thickness of said epitaxial layer between said second active region and said second region is larger than the thickness of said epitaxial layer between said first active region and said first region.

4. The semiconductor device according to claim 1, wherein said first active region includes a first well of the first conductivity type,
said second active region includes a second well of the second conductivity type,
an MOS (Metal Oxide Semiconductor) transistor of the second conductivity type is formed on said first well, and
an MOS transistor of the first conductivity type is formed on said second well.

5. The semiconductor device according to claim 4, wherein said first and second wells are retrograde wells.

6. The semiconductor device according to claim 1, further comprising,
a memory cell including a pair of driver MOS transistors, a pair of access MOS transistors, and a pair of load elements.

7. The semiconductor device according to claim 6, wherein said load elements are MOS transistors.

* * * * *